United States Patent
Kawagoe

(10) Patent No.: US 7,696,504 B2
(45) Date of Patent: Apr. 13, 2010

(54) PHASE CHANGE MEMORY DEVICE

(75) Inventor: Tsuyoshi Kawagoe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 151 days.

(21) Appl. No.: 11/857,707

(22) Filed: Sep. 19, 2007

(65) Prior Publication Data

US 2008/0067487 A1    Mar. 20, 2008

(30) Foreign Application Priority Data

Sep. 20, 2006    (JP) .............................. 2006-254480

(51) Int. Cl.
    *H01L 29/02*    (2006.01)
(52) U.S. Cl. .................... 257/2; 257/E45.002
(58) Field of Classification Search ...................... 257/2, 257/E45.002, 773
    See application file for complete search history.

(56) References Cited

U.S. PATENT DOCUMENTS

| 7,307,267 B2 | 12/2007 | Lankhorst et al. |
| 2008/0067487 A1* | 3/2008 | Kawagoe ..................... 257/3 |

FOREIGN PATENT DOCUMENTS

| JP | 2004-22653 A | 1/2004 |
| JP | 2006-511973 A | 4/2006 |
| JP | 2006-140395 A | 6/2006 |
| WO | 2004/057676 A3 | 7/2004 |

* cited by examiner

Primary Examiner—Mark Prenty
(74) Attorney, Agent, or Firm—Sughrue Mion, PLLC

(57) ABSTRACT

A phase change memory device comprises an insulating layer and a phase change layer formed on the insulating layer. A phase change layer has a pad portion. The pad portion is formed with at least one slit.

8 Claims, 9 Drawing Sheets

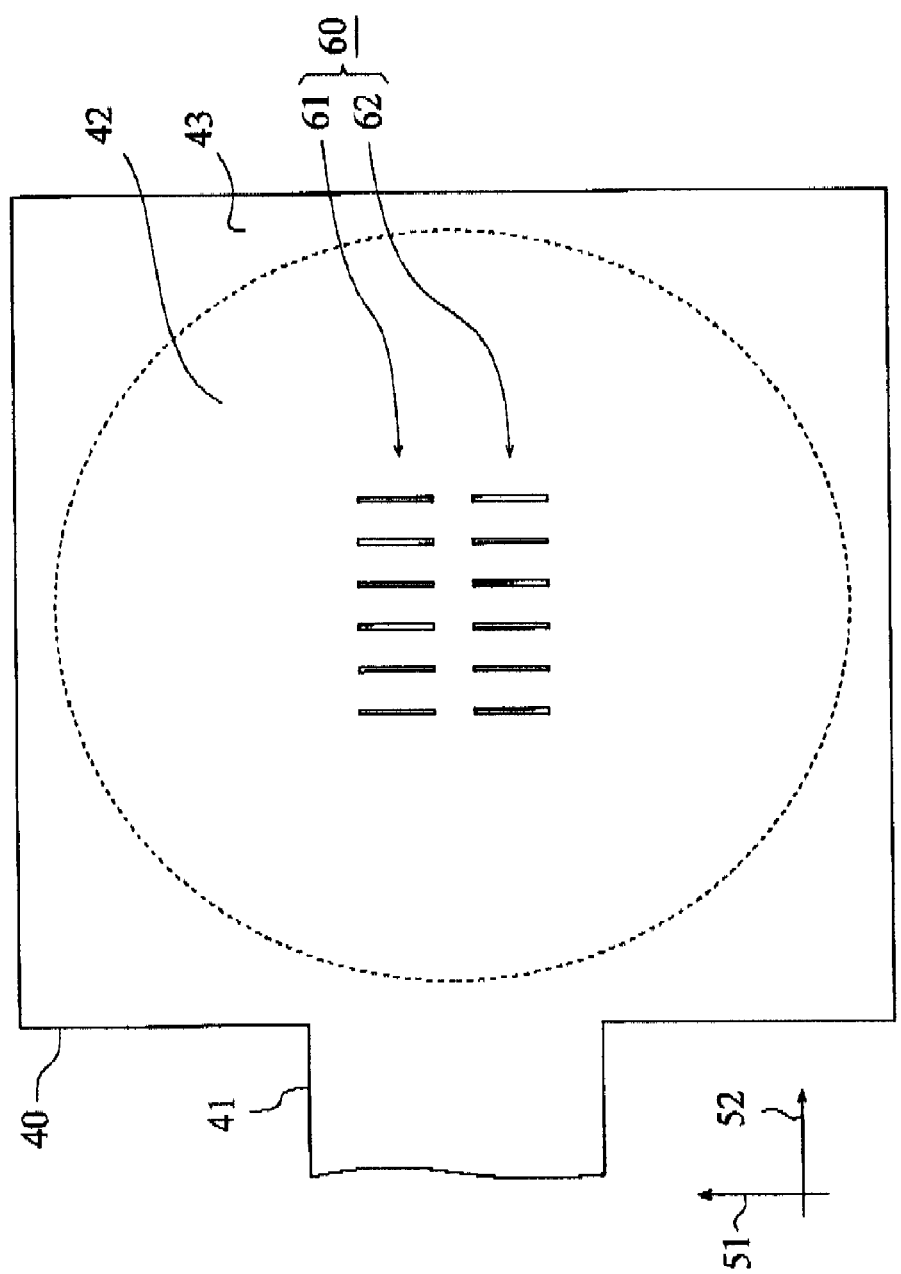

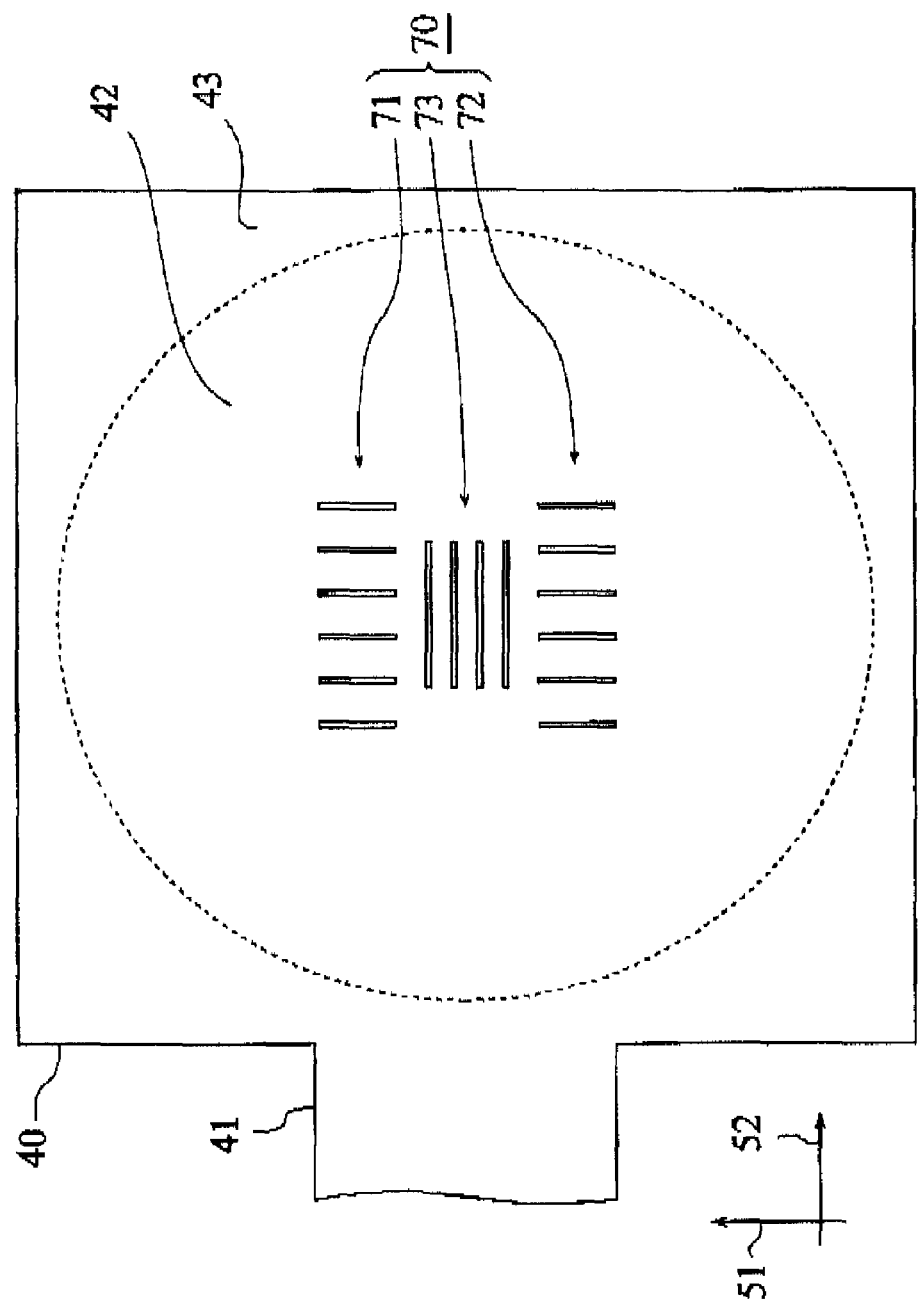

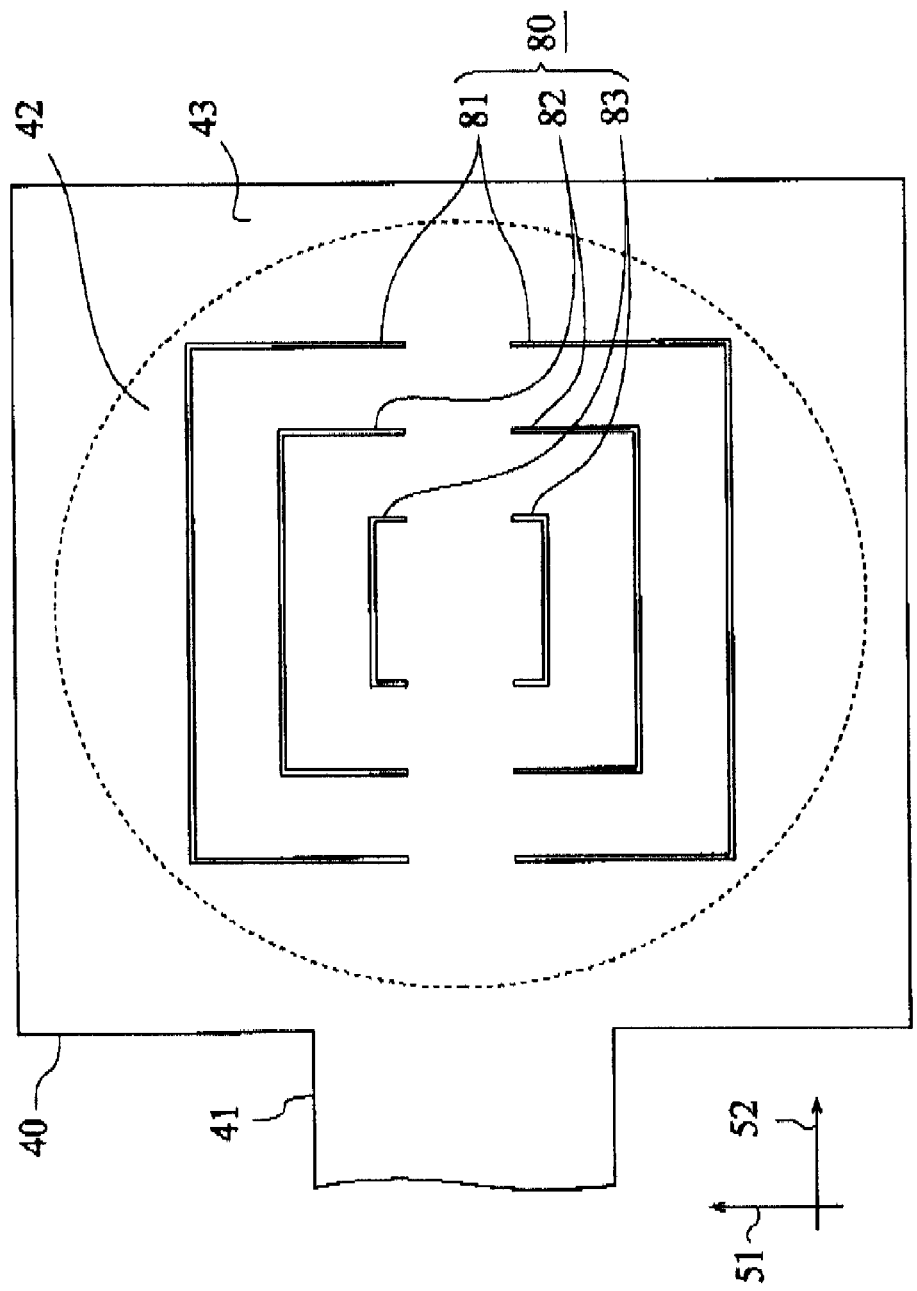

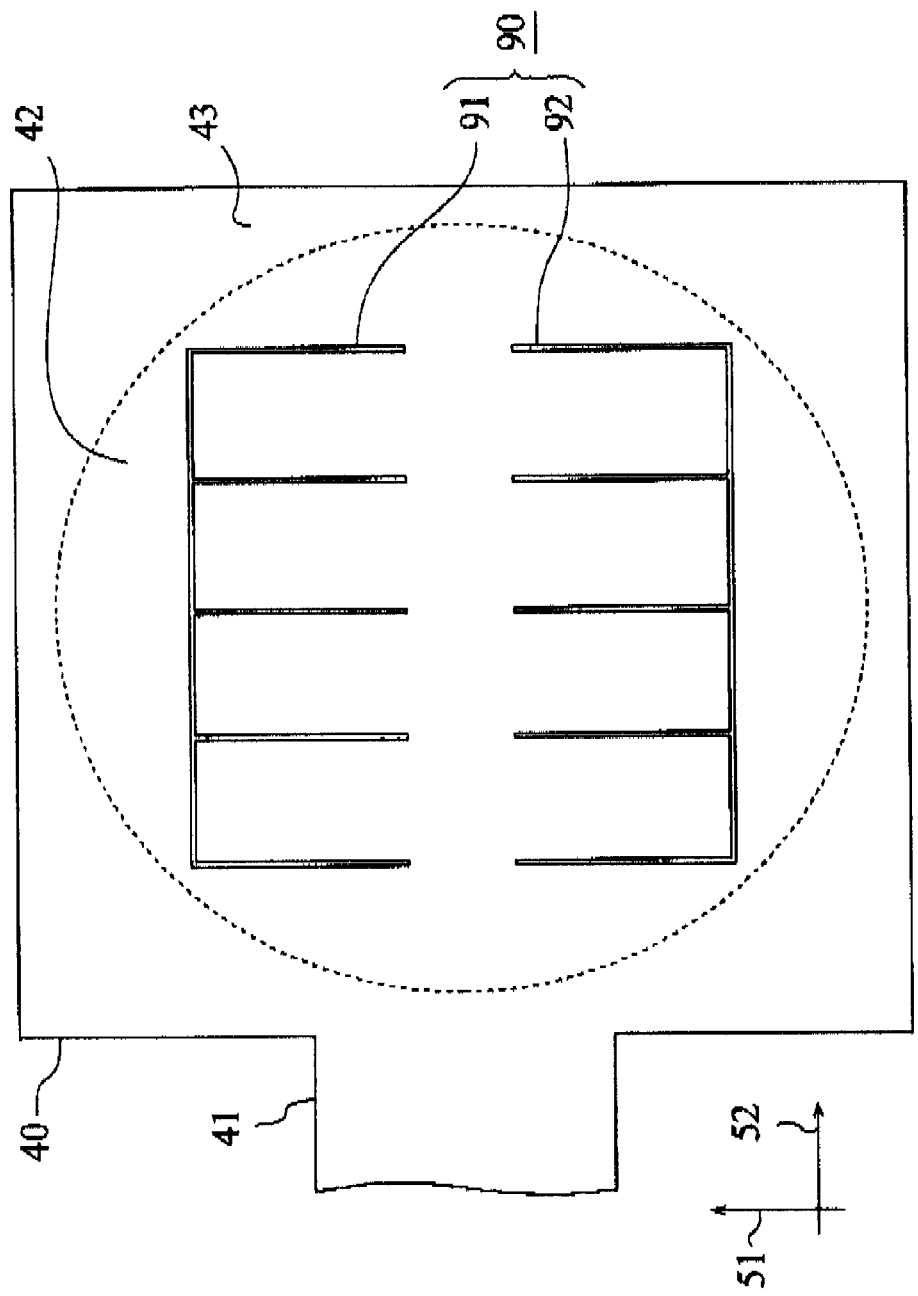

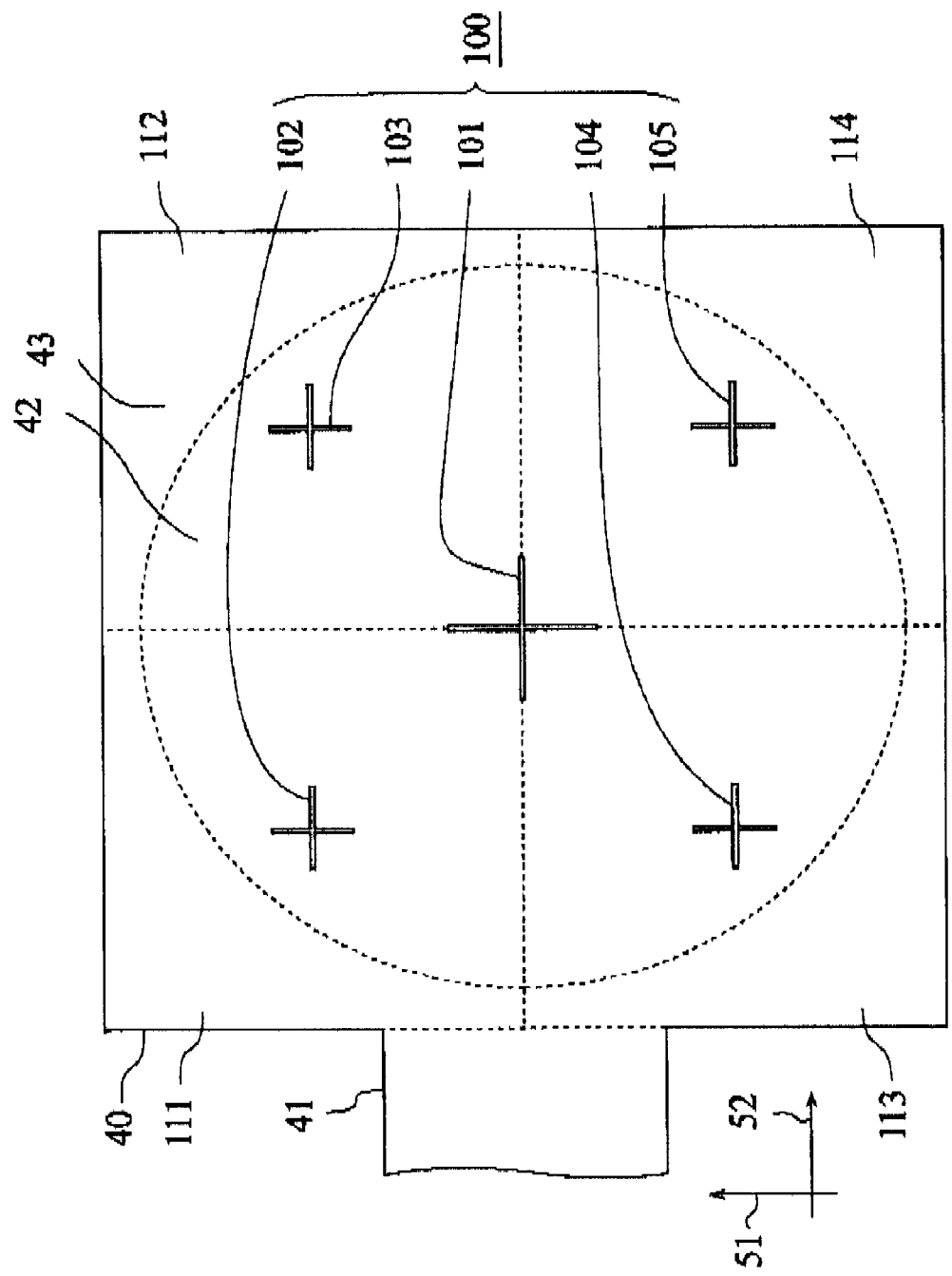

PHASE CHANGE MEMORY DEVICE

BACKGROUND OF THE INVENTION

This invention relates to a phase change memory device and a method of manufacturing the phase change memory device.

A phase change memory device is disclosed in, for example, JP-A 2004-22653A, the document being incorporated herein by reference in its entirety.

There is a need for a phase change memory device that has a phase change layer which is formed on an insulator layer and which does not easily peeled off or removed from the insulating layer during a heating process.

SUMMARY OF THE INVENTION

According to one aspect of the present invention, a phase change memory device comprises an insulating layer and a phase change layer formed on the insulating layer. The phase change layer has a pad portion. The pad portion is provided with at least one slit.

An appreciation of the objectives of the present invention and a more complete understanding of its structure may be had by studying the following description of the preferred embodiment and by referring to the accompanying drawings.

BRIEF DESCRIPTION OF THE DRAWINGS

FIG. 5 is a plan view of a pad portion according to a second embodiment of the present invention;

FIG. 6 is a plan view of a pad portion according to a third embodiment of the present invention;

FIG. 7 is a plan view of a pad portion according to a fourth embodiment of the present invention;

FIG. 8 is a plan view of a pad portion according to a fifth embodiment of the present invention; and FIG. 9 is a plan view of a pad portion according to a sixth embodiment of the present invention.

Figure 1:
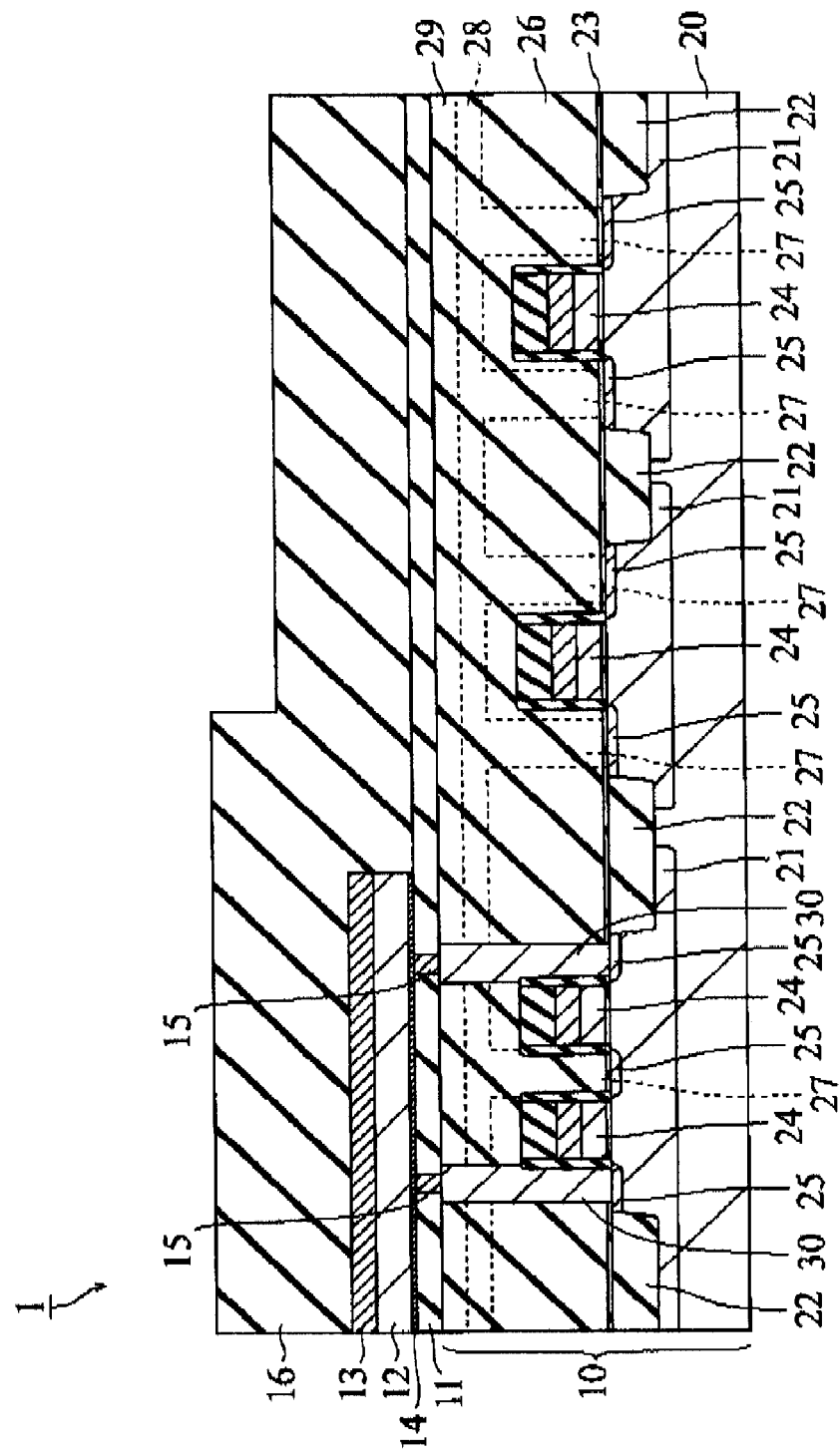
FIG. 1 is a cross-sectional view of a phase change memory device according to a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

First Embodiment

Referring to FIG. 1, a phase change memory device 1 according to a first embodiment of the present invention comprises a lower layer 10, an insulator layer 11, a phase change layer 12, a metal layer 13, an adhesive layer 14, heater electrodes 15, and an upper layer 16.

The lower layer 10 includes a silicon substrate 20, a plurality of impurity diffusion regions 21, a plurality of isolation regions 22, an insulator film 23, a plurality of gate electrodes 24, a plurality of source/drain regions 25, a first insulator layer 26, a plurality of first contact plugs 27, a wiring layer 28, a second insulator layer 29, and a plurality of second contact plugs 30.

The impurity diffusion layers 21 are formed in the silicon substrate 20.

The isolation regions 22 are formed in the silicon substrate 20 by forming a plurality of grooves in the silicon substrate 20, followed by filling the grooves with silicon oxide materials ($SiO_2$). The isolation regions 22 are provided so that the impurity diffusion regions 21 are isolated from each other by the isolation regions 22 and each of the impurity diffusion regions 21 is divided into a plurality of sections by the isolation region(s) 22.

The insulator film 23 is made of silicon oxide film and is formed on the surface of the silicon substrate 20 as well as on the surfaces of the plurality of the impurity diffusion layers 21 and the plurality of isolation layers 22.

The gate electrodes 24 are formed on the insulator film 23 at the positions over the impurity diffusion regions 21. Each of the gate electrodes 24 is made of a poly-silicon film (poly-Si) and a tungsten silicide film (WSi) stacked on the poly-silicon film. On the tungsten silicide film, a silicon nitride film (SiN) is formed. The silicon nitride film is used as a hard mask in the process of etching the gate electrodes 24. In addition, each of the gate electrodes 24 is formed with side walls. The side walls are formed by etchback of other silicon nitride films.

The source/drain regions 25 are formed by doping impurities to the surface of the impurity diffusion regions 21. The source/drain regions 25 are positioned on both sides of each of the gate electrodes 24.

The first insulator layer 26 is formed by depositing a silicon oxide material on the insulator film 23 and the gate electrodes 24, followed by exposing it to a CMP (Chemical Mechanical Polishing) process.

The first contact plugs 27 are formed as follows: first contact holes are formed in the first insulator layer 26 and the insulator film 23 by a photolithography process and a dry etching process, the first contact holes being positioned on the source/drain regions 25; the first contact holes are then filled with tungsten material; the excess amount of tungsten material is removed by a CMP process.

The wiring layer 28 is formed by patterning a tungsten film formed on the first insulator layer 26. The patterning of the tungsten film is carried out through a photolithography process and a dry etching process. The wiring layer 28 includes bit lines connected to the first contact plugs 27 as well as local interconnections of peripheral circuits.

The second insulator layer 29 is formed by depositing a silicon oxide material on the first insulator layer 26 and on the wiring layer 28, followed by exposing it to a CMP process.

The second contact plugs 30 are formed as follows: second contact holes are formed in the first insulator layer 26, the insulator film 23, and the second insulator layer 29 by a photolithography process and a dry etching process, the second contact holes being positioned on the source/drain regions 25; the second contact holes are then filled with poly-silicon material that is doped with the impurities; the excess amount of poly-silicon material is removed by a CMP process.

Description will now be made about the structure of the upper part, specifically above the lower layer 10, of the phase change memory 1 according to the present embodiment.

The insulator layer 11 is made of silicon oxide and is formed on the second insulator layer 29 and the second contact plugs 30. The insulator layer 11 may be made of other insulating materials such as silicon nitride film.

The heater electrodes 15 are made of tungsten. Each of the heater electrodes 15 is formed on the corresponding one of the second contact plugs 30 and penetrates the insulator layer 11 in the vertical direction.

The adhesive layer 14, the phase change layer 12, and the metal layer 13 are formed on the insulator layer 11 in this order. Herein, the adhesive layer 14 is made of titanium. The phase change layer 12 is made of GexSbyTez (GST). The metal layer 13 is made of tungsten. The shapes of the adhesive layer 14, the phase change layer 12, and the metal layer 13 are the same except for their thicknesses in the vertical direction. The adhesive layer 14, the phase change layer 12, and the metal layer 13 are formed above and over the second contact plugs 30. During the manufacturing process of the phase change memory device, the adhesive layer 14 may diffuse into the phase change layer 12 when heated. Therefore, there might not be an observable boundary between the phase change layer 12 and the metal layer 13. The material of the adhesive layer 14 is not limited to titanium.

The upper layer 16 is made of silicon oxide and is formed over the adhesive layer 14, the phase change layer 12, the metal layer 13, and the insulator layer 11.

The lower layer 10 and the upper layer 16 are provided with various components such as the wiring layer.

A thermal expansion rate of the GST (of the phase change layer 12) is $23 \times 10^{-6}$ (/K), a thermal expansion rate of the silicon oxide film (of the insulator layer 11) is $0.6 \times 10^{-6}$ (/K), and a thermal expansion rate of the tungsten (of the metal layer 13) is $4.5 \times 10^{-6}$ (/K). The thermal expansion rate of the phase change layer 12 is larger than that of the insulator layer 11 and the metal layer 13. The metal layer 13 may be made of titanium nitride having the thermal expansion rate of $9.35 \times 10^{-6}$ (/K).

Figure 2:
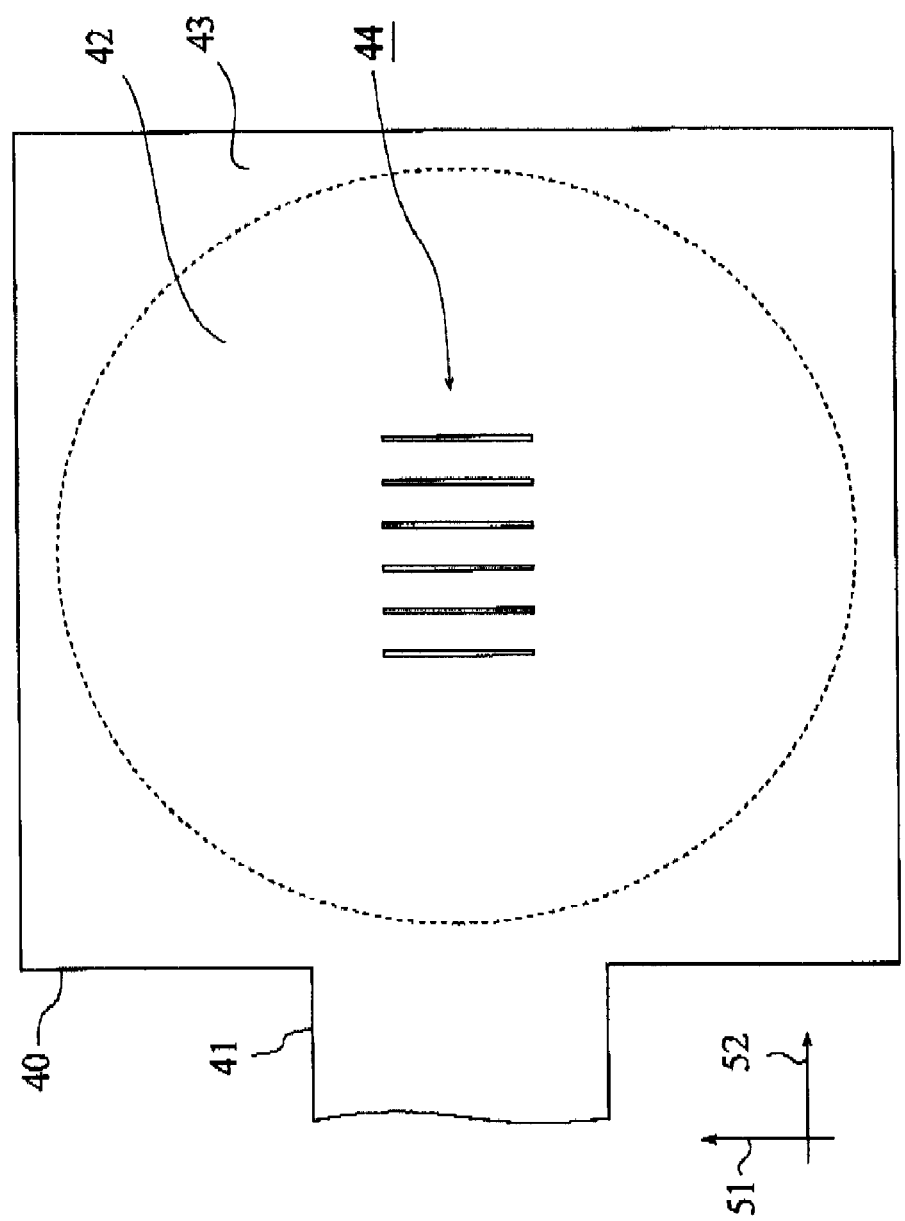
FIG. 2 is a plan view of a pad portion of a phase change layer of the phase change memory device of FIG. 1.

Referring to FIG. 2, the phase change layer 12 includes a pad portion 40 and a linear portion 41. The pad portion 40 has a square shape whose edges extend in a first direction 51 or a second direction 52 perpendicular to the first direction 51. The pad portion 40 is electrically connected with other layers via contact plugs. In this embodiment, the length of each side of the pad portion 40 is 100 μm.

In this embodiment, the pad portion 40 is connected to the linear portion 41 and has a width in the first direction 51 larger than the width of the linear portion 41. The pad portion 40 is used as a contact between the linear portion 41 and other components such as the wiring layer. The pad portion 40 may have various other shapes and functions. For example, the pad portion 40 may have a round shape or a polygonal shape. Moreover, the pad portion 40 may be a separated or an isolated portion to establish the electrical connections between the wiring layers.

In this embodiment, the pad portion 40 has a center portion 42 and a periphery portion 43. The center portion 42 has an outline of a circular shape which has a size not larger than the pad portion 40. The center portion 42 is surrounded by the periphery portion 43.

In this embodiment, slits 44 are formed on the center portion 42. The slits 44 extend in the first direction 51 and are spaced from each other in the second direction 52. All the slits 44 are formed on the center portion 42 and not on the periphery portion 43. Each of the slits 44 has a length of 10 μm in the first direction 51 and a width of 1 μm in the second direction 52. However, the shapes of the slits 44 are not limited to those described above.

During heating and cooling processes of the phase change memory device 1, the slits 44 prevent the pad portion 40 from being expanded and peeled off or removed from the insulator layer 11. In addition, the pad portion 40 is strongly adhered to the insulator layer 11 at the periphery portion 43 because no slits are formed thereon.

The metal layer 13 may also be provided with at least one slit communicating with the slit of the pad portion 40.

Contact plugs are formed above or below the pad portion 40 for electrically connecting the pad portion 40 with other layers. Preferably the contact plugs are formed on an area other than the slit-formed area.

The linear portion 41 has a phase change portion for storing information and is interposed between the heater electrodes 15 and the metal layer 13. The linear portion 41 is connected to one side of the pad portion 40. However, the pad portion 40 may not be connected to linear portion 41.

Figure 3:
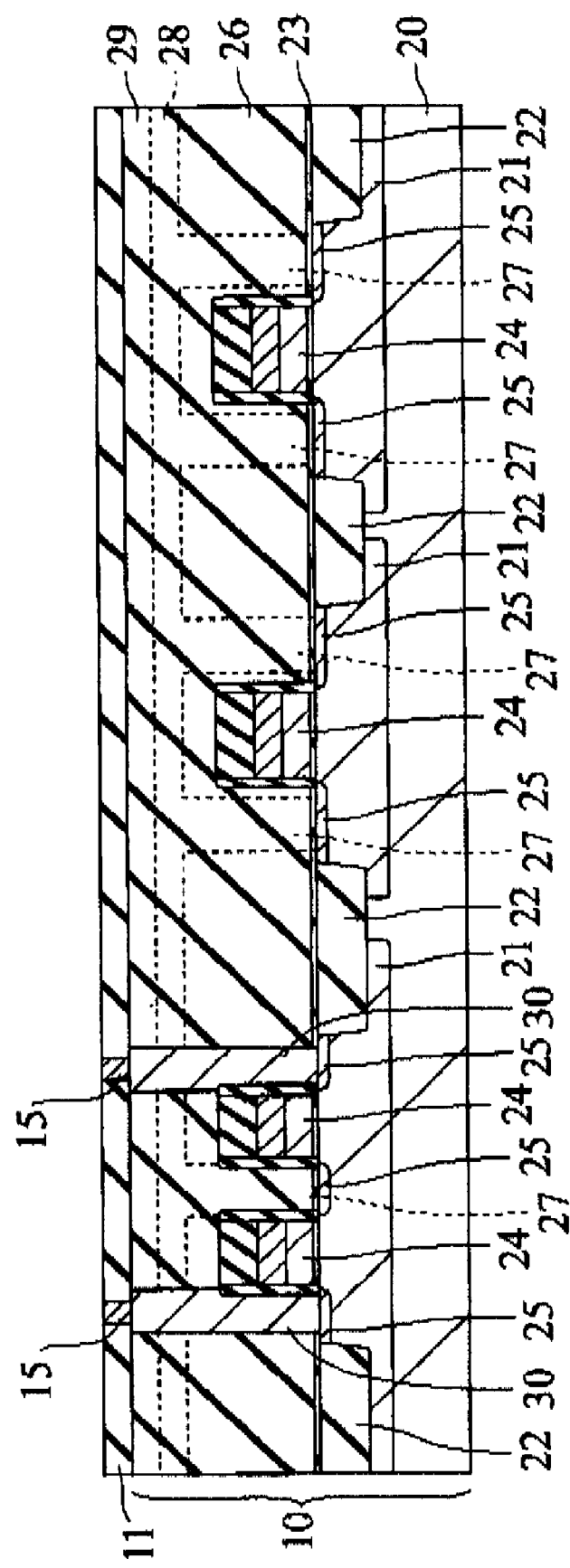
FIG. 3 is a cross-sectional view showing a fabrication process for the phase change memory device of FIG. 1.
Figure 4:
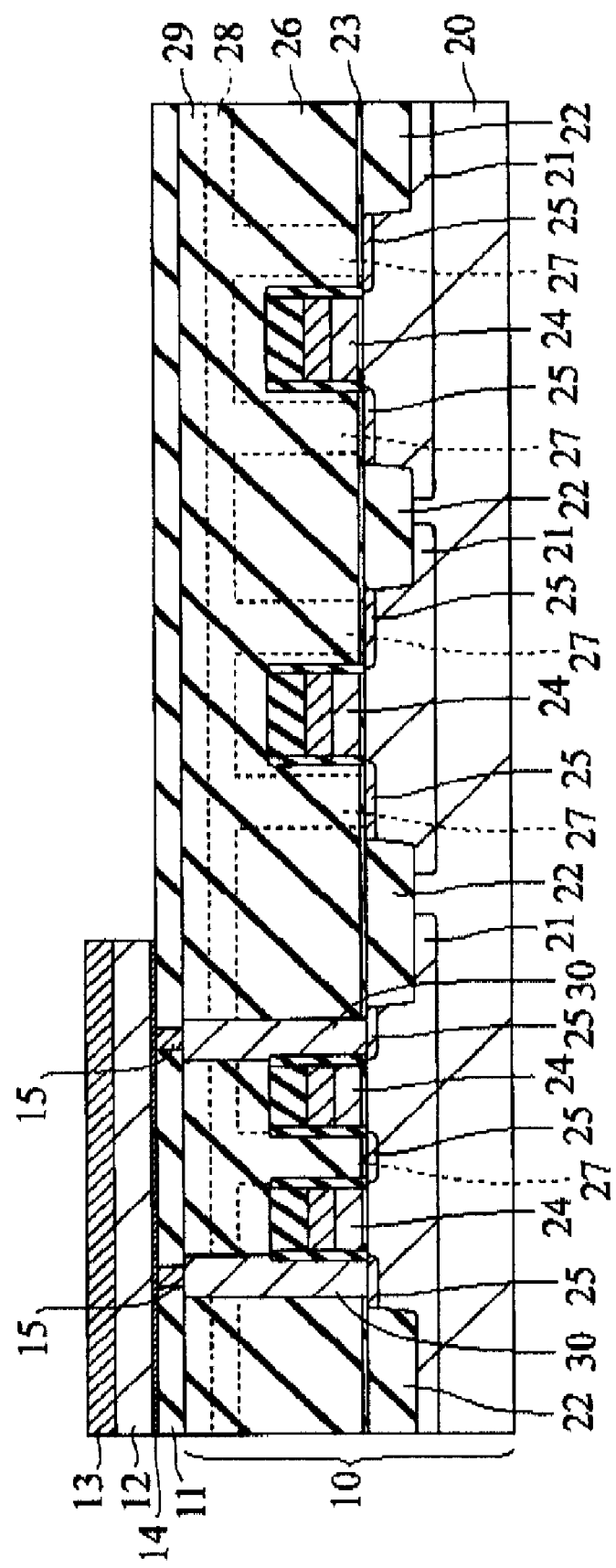
FIG. 4 is a cross-sectional view showing a subsequent fabrication process for the phase change memory of FIG. 1.

Referring to FIGS. 3 and 4, description will be made about a method of manufacturing the phase change memory device 1. The description will be particularly made about the processes to be carried out after the lower layer 10 has been formed.

With reference to FIG. 3, the insulator layer 11 is formed on the lower layer 10 so that the insulator layer 11 covers the second insulator layer 29 and the second contact plugs 30. The insulator layer 11 according to this embodiment is made of silicon oxide film; however, the insulator layer 11 may be made of other materials such as silicon nitride film.

Next, a plurality of third contact holes are formed in the insulator layer 11 by photolithography and dry etching processes. The formed third contact holes penetrate the insulator layer 11 in the vertical direction to reach the second contact plugs 30.

Next, a titanium film is formed in each of the third contact holes. Then the titanium nitride (TiN) film is formed in each of the third contact holes as a reaction prevention layer. Thereafter, a tungsten film as a conductive film is formed inside each of the third contact holes. Thus, the holes are completely filled. After the tungsten film is formed, the extra films are removed by a chemical mechanical polishing (CMP) process. The heater electrode 15 is thus formed in each of the third contact holes.

Next, titanium material, chalcogenide material, and tungsten material are deposited on the heater electrodes 15 and the insulator layer 11 in this order. The titanium material is deposited for 1 nm. The chalcogenide material is deposited for 100 nm. The tungsten material is deposited for 50 nm. Then the titanium material, the chalcogenide material, and the tungsten material are subjected to a patterning process by means of photolithography and dry etching. Thus the titanium material, the chalcogenide material, and the tungsten material are processed into the adhesive layer 14, the phase change layer 12, and the metal layer 13, respectively, as illustrated in FIG. 4 Subsequently, the upper layer 16 made of silicon oxide film is formed on the adhesive layer 14, the phase change layer 12, the metal layer 13, and the insulator layer 11, as shown in FIG. 1.

Second Embodiment

Referring to FIG. 5, the pad portion 40 is similar to that of FIG. 1 except for that the pad portion 40 according to this embodiment has slits 60 comprised of two slit groups; first slits 61 and second slits 62, both being formed on the center portion 42. The first slits 61 extend in the first direction 51 and are spaced from each other in the second direction 52. Similarly, the second slits 62 extend in the first direction 51 and are spaced from each other in the direction 52. The group of the slits 61 is arranged in parallel with the other group of slits 62. In this embodiment, each of the first and the second slits 61 and 62 has the length of 5 µm in the first direction 51 and the width of 1 µm in the second direction 52.

Third Embodiment

Referring to FIG. 6, the pad portion 40 is similar to that of FIG. 1 except for that the pad portion 40 has slits 70 comprised of three slit groups; first slits 71; second slits 72; and third slits 73, all of them being formed on the center portion 42. The first slits 71 extend in the first direction 51 and are spaced from each other in the second direction 52. Similarly, the second slits 72 extend in the first direction 51 and are spaced from each other in the second direction 52. The third slits 73 extend in the second direction 52 and are spaced from each other in the first direction 51. In other words, the longitudinal direction of the third slits 73 is perpendicular to that of the first and the second slits 71 and 72. The third slits 73 are positioned at the center of the center portion 42 and are sandwiched by the first and the second slits 71 and 72. In this embodiment, each of the first and the second slits 71 and 72 has the length of 5 µm in the first direction 51 and the width of 1 µm in the second direction 52. Each of the third slits 73 has the length of 10 µm in the second direction 52 and the width of 1 µm in the first direction 51.

Fourth Embodiment

Referring to FIG. 7, the pad portion 40 is similar to that of FIG. 1 except for that the pad portion 40 has slits 80 comprised of three slip groups: first slits 81; second slits 82; and third slits 83, all of them being formed on the center portion 42. Each of the first, the second, and the third slits 81, 82, and 83 comprises a long slit and two short slits. The short slits are coupled with the long slit at both ends so that each of the first, the second, and the third slits 81, 82, and 83 has a square bracket shape.

The first slits 81 are smaller than the second silts 82. The second slits 82 are smaller than the third slits 83. The third slits 83 are arranged in a partially-opened square form. The third slits 83 are arranged in the symmetrical shape. Each of the second slits 82 is formed inside each of the third slits 83 in the similar manner. Each of the first slits 81 is formed inside each of the second slits 82 in the manner similar to the second and the third slits 82 and 83. With this structure, the long slits extend in the second direction 52 and the short slits extend in the first direction 51.

Fifth Embodiment

Referring to FIG. 8, the pad portion 40 is similar to that of FIG. 1 except for that the pad portion 40 has slits 90 comprised of a first slit 91 and a second slit 92, both formed on the center portion 42. The first silts 91 has a long slit extending in the second direction 52 and short slits extending in the first direction 51 from the long slit such that each of the first slit 91 has a comb-like shape. Likewise, the second slit 92 has a comb-like shape. The slits 91 and 92 of the present embodiment are arranged in the symmetrical shape.

Sixth Embodiment

Referring to FIG. 9, the pad portion 40 is similar to that of FIG. 1 except for that the pad portion 40 has slits 100 comprised of first to fifth slits 101 to 105, all of them being formed on the center portion 42. Each of the first to the fifth slits 101 and 105 has a cross shape. The slit 101 is positioned at the center of the center portion 42. Assuming that the pad portion 40 is divided into four imaginary sections 111 to 114, each of the slits 102 to 105 is positioned at the center of each imaginary section 111 to 114, respectively.

The present application is based on Japanese patent applications of JP2006-254480 filed before the Japan Patent Office on Sep. 20, 2007, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A phase change memory device comprising an insulating layer and a phase change layer formed on the insulating layer,
    the phase change layer having a pad portion,
    the pad portion being provided with at least one slit.
2. A phase change memory device as claimed in claim 1, wherein
    the pad portion has a periphery portion and a center portion, the center portion being surrounded by the periphery portion, the at least one slit is formed on the center portion.
3. A phase change memory device as claimed in claim 2, wherein
    the center portion has an outline of a circular shape, a size of the outline being not larger than the pad portion.
4. A phase change memory device as claimed in claim 1, further comprising a metal layer formed on the phase change layer, the metal layer being provided with at least one additional slit communicating with the slit of the phase change layer.
5. A phase change memory device as claimed in claim 1, wherein an adhesive layer is provided between the insulating layer and the phase change layer.
6. A phase change memory device as claimed in claim 1, further comprising a metal layer formed on the phase change layer, the phase change layer having a thermal expansion rate which is larger than that of the metal layer and of the insulating layer.
7. A phase change memory device as claimed in claim 1, wherein the at least one slit comprises at least one first slit extending in a first direction and at least one second slit extending in a second direction perpendicular to the first direction.
8. A phase change memory device as claimed in claim 7, wherein the first slit and the second slit are coupled with each other.

* * * * *